(12) United States Patent
Shida

(10) Patent No.: US 11,360,692 B2
(45) Date of Patent: Jun. 14, 2022

(54) MEMORY CONTROLLER AND FLASH MEMORY SYSTEM LIMITING DATA TRANSFER RATE

(71) Applicant: TDK Corporation, Tokyo (JP)

(72) Inventor: Kazuo Shida, Tokyo (JP)

(73) Assignee: TDK CORPORATION, Tokyo (JP)

(*) Notice: Subject to any disclaimer, the term of this patent is extended or adjusted under 35 U.S.C. 154(b) by 43 days.

(21) Appl. No.: 16/687,155

(22) Filed: Nov. 18, 2019

(65) Prior Publication Data

US 2020/0159442 A1 May 21, 2020

(30) Foreign Application Priority Data

Nov. 20, 2018 (JP) .............................. JP2018-217601

(51) Int. Cl.
| G06F 3/06 | (2006.01) |
| G11C 16/10 | (2006.01) |
| G11C 16/26 | (2006.01) |
| G11C 16/32 | (2006.01) |
| G11C 7/04 | (2006.01) |

(52) U.S. Cl.
CPC .......... *G06F 3/0653* (2013.01); *G06F 3/0611* (2013.01); *G06F 3/0679* (2013.01); *G11C 7/04* (2013.01)

(58) Field of Classification Search
CPC .... G06F 3/0653; G06F 3/0611; G06F 3/0679; G06F 3/0614; G06F 3/0659; G11C 7/04; G11C 16/10; G11C 16/26; G11C 16/32
See application file for complete search history.

(56) References Cited

U.S. PATENT DOCUMENTS

| 6,772,352 | B1 | 8/2004 | Williams et al. |
| 7,403,440 | B2 * | 7/2008 | Perner ...................... G11C 7/04 365/211 |
| 7,817,492 | B2 * | 10/2010 | Kanari ..................... G11C 8/16 365/230.05 |
| 7,961,547 | B2 * | 6/2011 | Kanari .................. G11C 11/412 365/230.05 |
| 8,639,468 | B2 * | 1/2014 | Cloetens .................. G01K 7/42 702/132 |
| 9,189,163 | B2 * | 11/2015 | Bhuiyan ............. G06F 13/1694 |
| 9,372,818 | B2 * | 6/2016 | Lunadier ............... G06F 13/362 |
| 9,525,440 | B2 * | 12/2016 | Champagne ............ H04B 1/04 |
| 10,043,456 | B1 * | 8/2018 | de Greef ................ G09G 3/348 |
| 10,419,855 | B2 * | 9/2019 | Hare ........................ H05B 3/30 |
| 2006/0280012 | A1 * | 12/2006 | Perner ............... G11C 11/40626 365/212 |
| 2011/0026311 | A1 * | 2/2011 | Kanari .................. G11C 11/412 365/154 |
| 2015/0189788 | A1 * | 7/2015 | Champagne ........... H04B 1/036 455/127.1 |

(Continued)

FOREIGN PATENT DOCUMENTS

JP          2011-003018 A          1/2011

*Primary Examiner* — Christopher D Birkhimer
(74) *Attorney, Agent, or Firm* — McDermott Will & Emery LLP

(57) ABSTRACT

Disclosed herein is a memory controller controlling data transfer between a host system and a flash memory. The memory controller is configured to limit a data transfer rate in a second period following a first period to a predetermined rate lower than a maximum rate when the data transfer rate in a first period satisfies a predetermined condition.

8 Claims, 9 Drawing Sheets

(56) References Cited

U.S. PATENT DOCUMENTS

| | | | |
|---|---|---|---|
| 2016/0014685 A1* | 1/2016 | Kneckt | H04W 76/10 |
| | | | 455/422.1 |
| 2016/0085444 A1 | 3/2016 | Tanzawa | |
| 2016/0334992 A1* | 11/2016 | Yashiro | G11C 7/04 |
| 2016/0366219 A1* | 12/2016 | Ohana | H04L 67/32 |
| 2017/0017593 A1* | 1/2017 | Lunadier | G06F 13/368 |
| 2017/0345510 A1* | 11/2017 | Achtenberg | G11C 29/52 |
| 2018/0358080 A1* | 12/2018 | Huang | G11C 7/04 |
| 2019/0166431 A1* | 5/2019 | Hare | H04R 9/022 |

\* cited by examiner

| TRANSFER RATE | SCORE INCREASE/ DECREASE |
|---|---|
| 100% | +10 |
| 90% | +8 |
| 80% | +6 |
| 70% | +4 |
| 60% | +3 |
| 50% | +2 |
| 40% | +1 |
| 30% | ±0 |
| 20% | −10 |
| 10% | −20 |
| 0% | −25 |

FIG. 3

| TRANSFER RATE | SCORE |
|---|---|
| 100% | Tmax100 |
| 90% | Tmax90 |
| 80% | Tmax80 |
| 70% | Tmax70 |
| 60% | Tmax60 |
| 50% | Tmax50 |
| 40% | Tmax40 |
| 30% | Tmax30 |
| 20% | Tmax20 |
| 10% | Tmax10 |
| 0% | Tmax0 |

FIG. 4

| TRANSFER RATE | SCORE INCREASE/DECREASE |
|---|---|
| 100%→90% | $-(Tmax100-Tmax90)/t_{100.90}$ |
| 100%→80% | $-(Tmax100-Tmax80)/t_{100.80}$ |
| 100%→70% | $-(Tmax100-Tmax70)/t_{100.70}$ |
| 100%→60% | $-(Tmax100-Tmax60)/t_{100.60}$ |
| 100%→50% | $-(Tmax100-Tmax50)/t_{100.50}$ |
| 100%→40% | $-(Tmax100-Tmax40)/t_{100.40}$ |
| 100%→30% | $-(Tmax100-Tmax30)/t_{100.30}$ |
| 100%→20% | $-(Tmax100-Tmax20)/t_{100.20}$ |
| 100%→10% | $-(Tmax100-Tmax10)/t_{100.10}$ |
| 100%→0% | $-(Tmax100-Tmax0)/t_{100.0}$ |

FIG. 7

MEMORY CONTROLLER AND FLASH MEMORY SYSTEM LIMITING DATA TRANSFER RATE

BACKGROUND OF THE INVENTION

Field of the Invention

The present invention relates to a memory controller and a flash memory system having the same and, more particularly, to a memory controller capable of controlling heat generation due to data transfer and a flash memory system having the same.

Description of Related Art

A flash memory system has a memory controller provided between a host system and a flash memory. The memory controller controls the operation of the entire flash memory system and, at the same time, controls data transfer between the host system and the flash memory.

When a large capacity of data is transferred between the memory controller and the host system or the memory controller and the flash memory, current consumption increases in the memory controller, which may become a heat source. The tendency of heat generation in an interface part having many output buffers is particularly remarkable and this can increase a possible risk of thermal runaway. To prevent the above problem, WO 2016/048586 A1 proposes a method that measures the current temperature of the flash memory system using a temperature sensor and controls access time on the basis of the measured temperature.

However, with this method, it is impossible to stop the thermal runaway if an abnormality occurs in the temperature sensor.

SUMMARY

It is therefore an object of the present invention to provide a memory controller capable of controlling heat generation due to data transfer even in case of an abnormality in a temperature sensor or even in the absence of a temperature sensor, and a flash memory system having the memory controller.

A memory controller according to the present invention is a memory controller that controls data transfer between a host system and a flash memory and, when the data transfer rate in a first period satisfies a predetermined condition, limits the data transfer rate in a second period following the first period to a predetermined rate lower than a maximum rate. Further, a flash memory system according to the present invention includes the above memory controller and a flash memory.

According to the present invention, the current temperature is estimated on the basis of the history of the data transfer rate and, when a predetermined condition is satisfied, the data transfer rate is limited to a predetermined rate lower than a maximum rate. Thus, it is possible to control heat generation due to data transfer even in case of an abnormality in a temperature sensor, or even in the absence of a temperature sensor.

In the present invention, the predetermined rate may be gradually decreased in the second period. This can prevent a sudden drop of the data transfer rate.

In the preset invention, a limit to the data transfer rate may be released in a third period following the second period. This allows the flash memory system to operate at a high data transfer rate at the timing when the estimated temperature has sufficiently decreased.

In the present invention, the temperature score is increased/decreased according to the data transfer rate per unit time in the first period and, when the temperature score exceeds a threshold value, it can be determined that the predetermined condition is satisfied. This allows the current temperature to be estimated more accurately. Further, in this case, the temperature score may be increased/decreased according to a change in the data transfer rate per unit time in the first period. This allows the current temperature to be estimated even more accurately.

In the present invention, the temperature score may be corrected by keeping the data transfer rate constant for a predetermined period or by recognizing that a period during which data transfer is not performed has been continued for a certain period or more. This can prevent deviation between the actual temperature and the temperature score.

As described above, according to the present invention, it is possible to control heat generation due to data transfer even in case of an abnormality occurring in a temperature sensor or even in the absence of a temperature sensor.

BRIEF DESCRIPTION OF THE DRAWINGS

The above features and advantages of the present invention will be more apparent from the following description of certain preferred embodiments taken in conjunction with the accompanying drawings, in which:

FIG. 3 is a table illustrating a simplest example of a criterion for increase or decrease in a temperature score S;

FIG. 4 is a table illustrating the value of the temperature score S for each data transfer rate, obtained based on actual measurement results;

FIG. 7 is a table illustrating the inclination of the temperature score S when the data transfer rate is changed from 100% to 0% to 90%;

DETAILED DESCRIPTION OF THE EMBODIMENTS

Preferred embodiments of the present invention will be explained below in detail with reference to the accompanying drawings.

Figure 1:
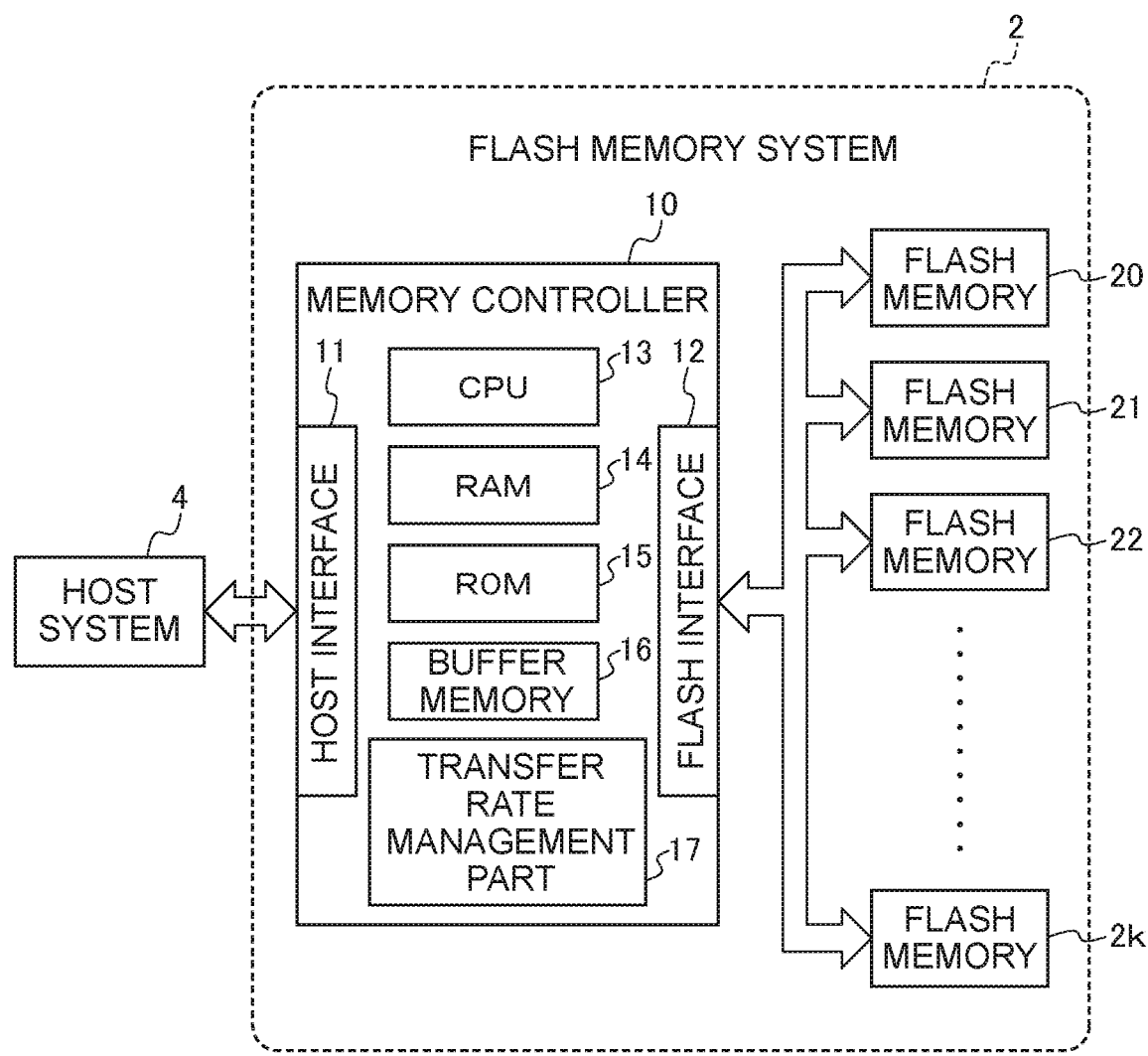
FIG. 1 is a block diagram for explaining a flash memory system 2 according to a preferred embodiment of the present invention.

FIG. 1 is a block diagram for explaining the configuration of a flash memory system 2 according to a preferred embodiment of the present invention.

The flash memory system 2 according to the preset embodiment includes a memory controller 10 and a plurality of flash memories 20 to 2 k. Although not particularly limited, the flash memories 20 to 2 k are each a NAND-type flash memory. Although k+1 flash memories 20 to 2 k are mounted in the example of FIG. 1, there is no particular restriction on the number of flash memories to be mounted.

The memory controller 10 is provided between an external host system 4 and flash memories 20 to 2 k and controls data transfer therebetween. Data and commands are exchanged between the host system 4 and the memory controller 10 through a host interface 11, and data and commands are exchanged between the flash memories 20 to 2 k and the memory controller 10 through a flash interface 12.

The memory controller 10 includes a CPU 13, a RAM 14, a ROM 15, a buffer memory 16 and a transfer rate management part 17. The CPU 13 controls the entire operation of the memory controller 10 according to a program stored in the ROM 15. The program stored in the ROM 15 may be expanded in the RAM 14 at power-on. The RAM 14 is a work area that temporarily stores data necessary for controlling the flash memories 20 to 2 k and is constituted of a plurality of SRAM cells. The buffer memory 16 is a circuit that temporarily stores read data read out from the flash memories 20 to 2 k and write data to be written in the flash memories 20 to 2 k. Part of the RAM 14 may be used as the buffer memory 16. The write data supplied from the host system 4 is temporarily stored in the buffer memory 16 and then transferred to the flash memories 20 to 2 k through the flash interface 12 after the flash memories 20 to 2 k are brought into a writable state. The read data read out from the flash memories 20 to 2 k is temporarily stored in the buffer memory 16 and then transferred to the host system 4 through the host interface 11 after the host system 4 is brought into a data acceptable state.

The memory controller 10 further includes a transfer rate management part 17. The transfer rate management part 17 is a circuit that controls data transfer rate using the host interface 11 and the flash interface 12. Data transfer involves the consumption of a large current in the memory controller. In particular, many output buffers are included in the host interface 11 and flash interface 12, so that heat generation is large due to switching operation. Therefore, if data transfer is continued at a maximum rate, the temperature of the flash memory system 2 may undesirably reach the limit value of an operating temperature range. In general flash memory systems, a temperature sensor is used to measure the current temperature, while in the flash memory system 2 according to the present invention, the current temperature is estimated by monitoring data transfer using the host interface 11 and the flash interface 12, and the data transfer rate is limited according to the estimated temperature to thereby suppress the current temperature to a predetermined value or less. The transfer rate management part 17 may be a dedicated circuit provided separately from the CPU 13, RAM 14 and ROM 15, or some or all functions thereof may be realized by the CPU 13, RAM 14 or ROM 15.

Figure 2:
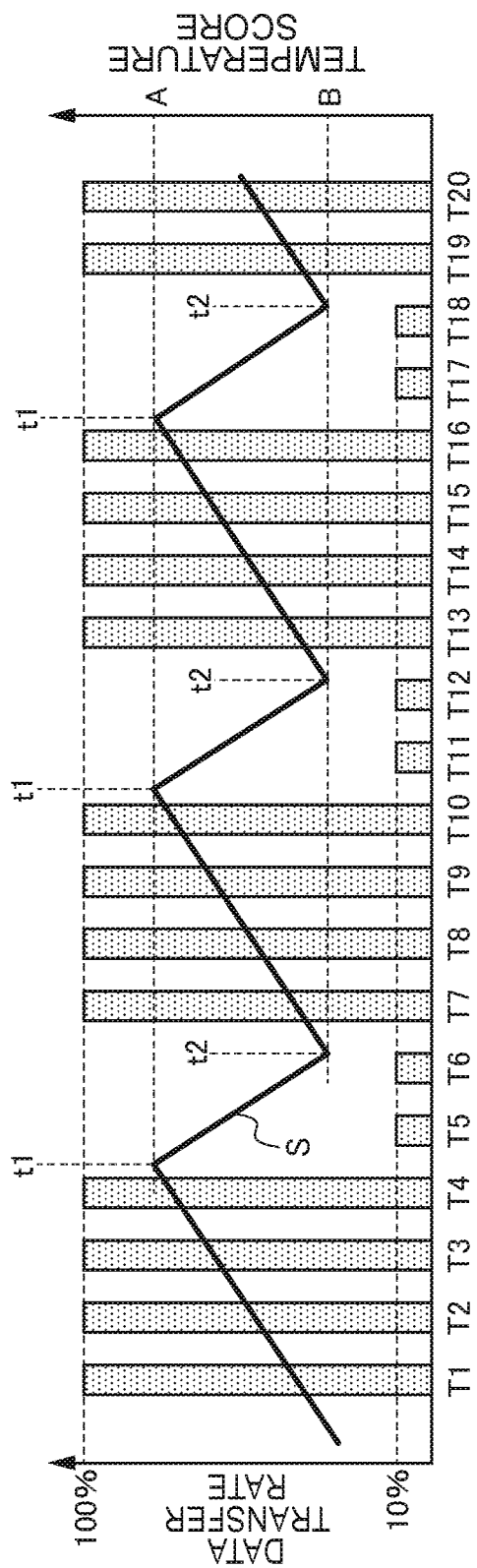
FIG. 2 is a graph illustrating an example of data transfer rate control by a transfer rate management part 17.

FIG. 2 is a graph illustrating an example of data transfer rate control by the transfer rate management part 17. The data transfer rate illustrated in FIG. 2 is the sum of the transfer rate of read data (at the time of data output from the memory controller to the host system) transferred using the host interface 11 and the transfer rate of write data (at the time of data output from the memory controller to the flash memory) transferred using the flash interface 12 (however, the data transfer rate handled here may not necessarily be the sum of the read and write data, but these data may be individually managed). T1 to T20 are each a period having a predetermined unit time.

In the example of FIG. 2, a period during which the data transfer rate is 100%, that is, data transfer is performed at the system's (standard's) maximum rate and a period during which the data transfer rate is suppressed to 10% of the maximum rate are alternately repeated. Such control is achieved by the transfer rate management part 17 increasing/decreasing a temperature score S. That is, as illustrated in FIG. 2, in a first period (e.g., periods T1 to T4) during which the data transfer rate is 100%, the temperature score S is increased and reaches a threshold value A at time t1. In response to this, the transfer rate management part 17 limits the data transfer rate at and after time t1 to, e.g., 10% of the maximum rate. In the example illustrated in FIG. 2, in a second period (e.g., periods T5 to T6), the data transfer rate is limited to 10% of the maximum rate.

The data transfer rate is thus limited and, correspondingly, the heat generation significantly decreases, with the result that the temperature score S decreases and reaches a threshold value B at time t2. In response to this, the transfer rate management part 17 releases the limit on the data transfer rate at and after time t2, with the result that the data transfer rate becomes 100% again. In the example illustrated in FIG. 2, in a third period (e.g., periods T7 to T10), the data transfer rate becomes 100% again.

The above operation is repeated and, in the example illustrated in FIG. 2, the limit on the data transfer rate is released in the periods T1 to T4, T7 to T10, T13 to T16 and T19 to T20, while the data transfer rate is limited to 10% of the maximum rate in the periods T5 to T6, T11 to T12 and T17 to T18.

The data transfer rate limited when the temperature score S reaches the threshold value A may not necessarily be 10% of the maximum rate and suffices if it shows a certain rate lower than the maximum rate. When the temperature score S reaches the threshold value A, the data transfer rate may be decreased to 0%, that is, data transfer may be stopped. The lower the data transfer rate after the temperature score S reaches the threshold value S is, the faster the flash memory system 2 can be cooled. Further, a plurality of values may be set as the threshold value A and, in this case, the limit amount of the data transfer rate may be changed according to the type of the threshold value that the temperature score S exceeds.

A criterion for increase or decrease in the temperature score S is not particularly limited as far as it is set considering a system configuration, a system environment and the like so as to allow the temperature score S to trace the actual temperature as accurately as possible. FIG. 3 illustrates a simplest example of the increase/decrease criterion of the temperature score S. In the example of FIG. 3, the transfer rate and increase/decrease amount of the temperature score S are set for each unit time, based on which the current temperature score S is determined. For example, when the data transfer rate in the periods T1 to T4 is 100% as illustrated in FIG. 2, the temperature score S is increased in increments of 10 for each of the periods T1 to T4. When the data transfer rate in the periods T5 to T6 is 10%, the temperature score S is decreased in increments of 20 for each of the periods T5 to T6. Such a method makes it very easy to calculate the temperature score S.

Further, when the relationship between the transfer rate and the temperature score S is defined more strictly by actual temperature measurement results in design stage, it is possible to allow the temperature score S to trace the actual temperature more accurately. The following describes specific examples.

Figure 5:
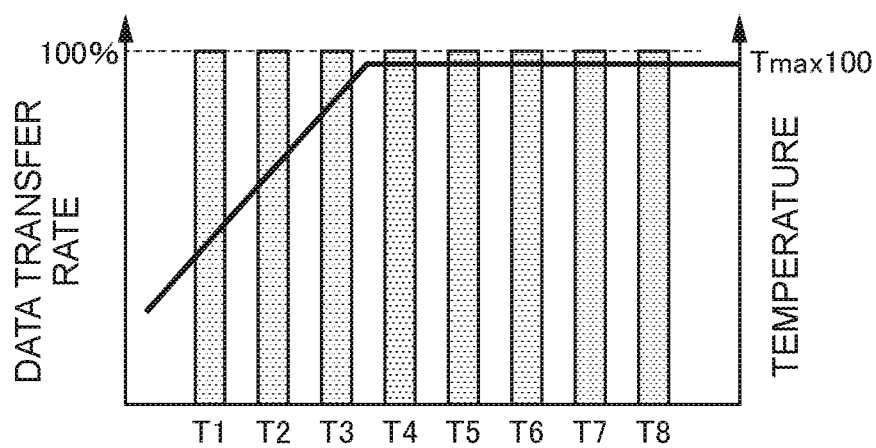
FIG. 5 is a graph for explaining a method of specifying the value of the temperature score S when the data transfer rate is 100%.

First, the value of the temperature score S is set on the basis of the actual temperature when the transfer rate is kept constant. For example, as illustrated in FIG. 4, the value of the temperature score S when the transfer rate is kept at 100% is assumed to be Tmax100, and the value of the temperature score S when the transfer rate is kept at 90% is assumed to be Tmax90. These values of the temperature score S correspond to temperatures actually measured in design stage. For example, the data transfer rate is fixed at 100% as illustrated in FIG. 5. In this case, when the temperature at the start of the period T1 is a room temperature, the temperature score S reaches the maximum temperature, i.e., Tmax100 in the period T4 and is thereafter kept thereat. This temperature is defined as Tmax100. The temperature values in other data transfer rates are actually measured in the same manner.

Figure 6:
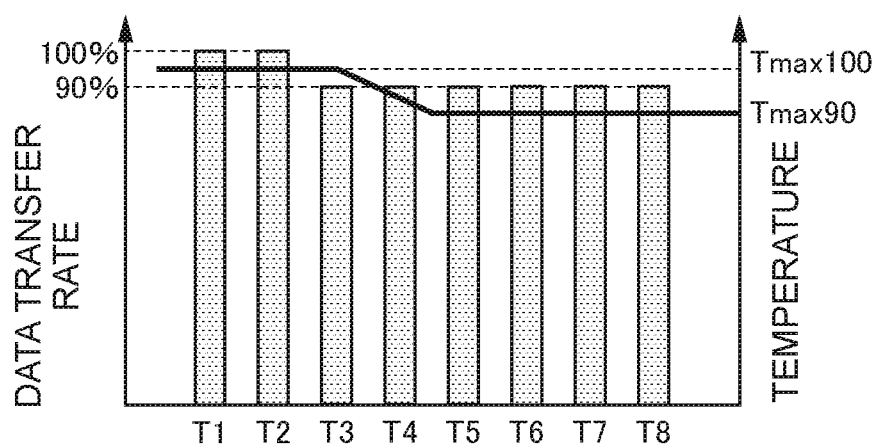
FIG. 6 is a graph illustrating a method of specifying the inclination of the temperature score S when the data transfer rate is changed from 100% to 90%.

Then, a temperature change when the data transfer rate is changed is actually measured, and the change amount of the temperature score S is defined on the basis of the measured temperature change. For example, as illustrated in FIG. 6, when the data transfer rate is changed to 90% in a state where the temperature reaches the Tmax100 by fixing the data transfer rate at 100%, time required for the temperature to reach the Tmax90 is measured, and the change amount of the temperature score S is defined on the basis of the measured time. Assuming that time required for the temperature to change from the Tmax100 to Tmax90 is t100.90, the inclination (change amount per unit time) of the temperature score S when the data transfer rate is changed from 100% to 90% can be defined as: $-(Tmax100-Tmax90)/t100.90$. FIG. 7 illustrates the inclination of the temperature score S when the data transfer rate is changed from 100% to 0% to 90%. Then, by actually measuring all combinations of the data transfer rates, the inclination of the temperature score S for each of all combinations of the data transfer rates is determined.

The above-described value (Tmax100 and the like) of the temperature score S and the inclination of the temperature score S differ depending on a system configuration, a system environment and the like (for example, the presence/absence of a heat sink, the size of the heat sink, if any, and capability of a cooling fan). Therefore, the actual measurement is preferably performed for each specification. Alternatively, the actual measurement may be performed in a representative system configuration and under a typical system environment, and the value and inclination of the temperature score S may be corrected for each specification.

Then, in an actual operation time of the flash memory system 2, the temperature score S (e.g., Tmax 100) is acquired by fixing the data transfer rate at a predetermined value (e.g., 100%), and thereafter, every time the data transfer rate is changed, the temperature score S is increased/decreased according to a corresponding inclination. In the example of FIG. 2, the temperature score S is set to Tmax100 in response to the continuous operation with 100% data transfer rate from the periods T1 to T4, and the temperature score S is changed by $-(Tmax100-Tmax10)/t100.10$ in response to a change in the data transfer rate from 100% to 10% in the period T5. According to such a method, it is possible to allow the temperature score S to trace the actual temperature more accurately.

Figure 8:
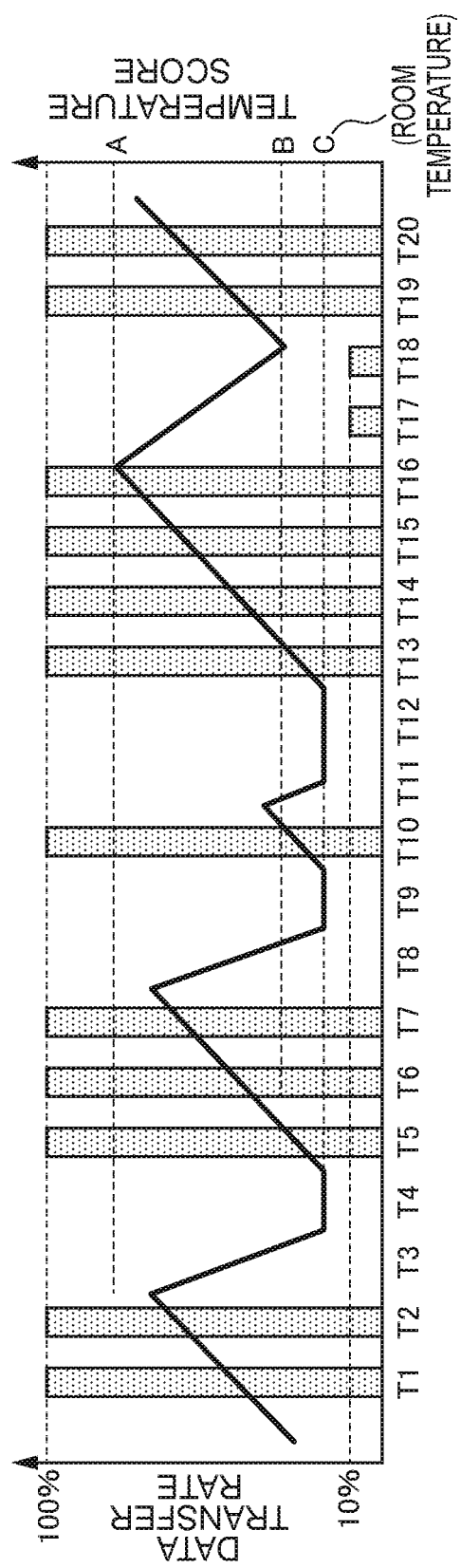
FIG. 8 is a graph illustrating an example of data transfer rate control performed by a transfer rate management part 17.

As another example, FIG. 8 illustrates an example in which data transfer is intermittently performed. That is, in the periods T3, T4, T8, T9, T11 and T12, no data transfer request is issued from the host system 4, and thus data transfer is not performed. In such a case, the flash memory system 2 is sufficiently cooled in the period during which data transfer is not performed, so that the temperature score S is maintained at a value equal to or less than the threshold value A. In particular, when it is determined that the temperature of the flash memory system 2 has been reduced to room temperature, the temperature score S may be fixed at a minimum value C. In the example illustrated in FIG. 8, the temperature score S reaches the threshold value A in the period T16 and, in response to this, the data transfer rate in the periods T17 and T18 is limited to 10%.

When the data transfer rate is continuously changed in a short period of time, deviation between the temperature score S and the actual temperature may become large; therefore, it is preferable to correct the temperature score S by fixing the data transfer rate at a predetermined rate (e.g., 50%) for a certain period. For example, when the data transfer rate is fixed at 50%, the corrected temperature score S becomes Tmax50, and this value is overwritten in the transfer rate management part 17.

As described above, the flash memory system 2 according to the present embodiment estimates the current temperature on the basis of the history of the previous data transfer rate and limits the data transfer rate according to the estimated current temperature. Thus, it is possible to maintain the temperature of the flash memory system 2 at a predetermined value or less even in case of an abnormality in a temperature sensor, or even in the absence of a temperature sensor. This makes it possible to prevent a thermal runaway due to, e.g., an abnormality in a temperature sensor. However, in the present invention, the temperature sensor need not be eliminated, but the data transfer rate may be controlled by using both the temperature score S and the actual measurement value obtained by the temperature sensor.

Figure 9:
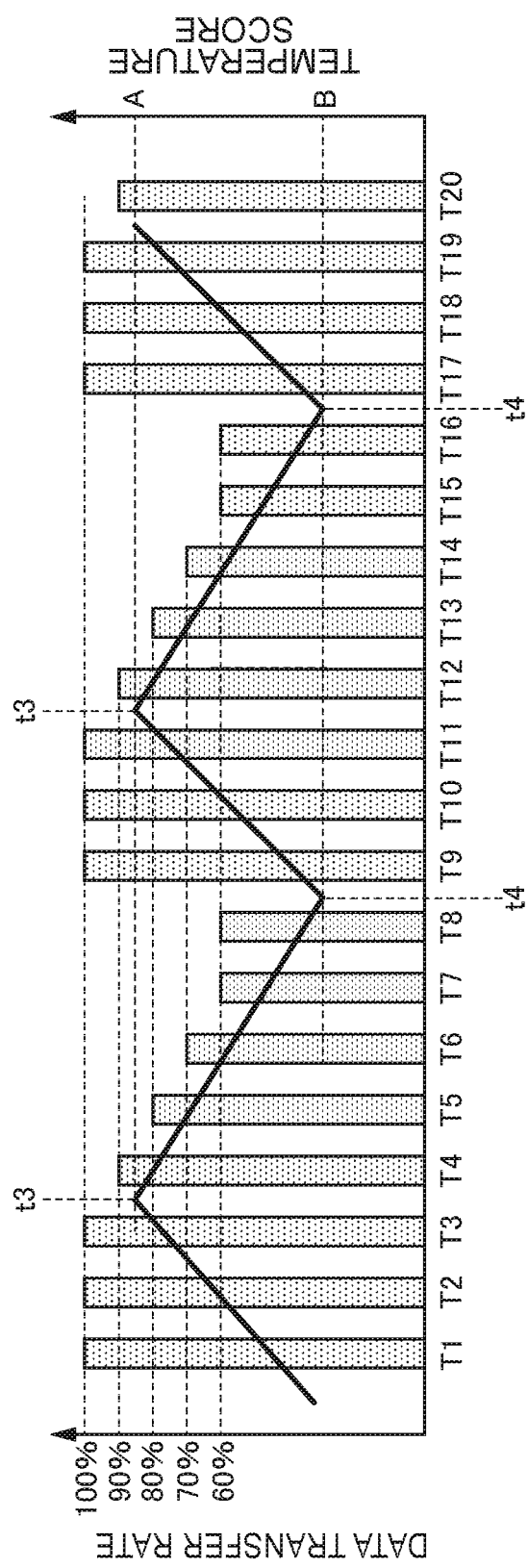
FIG. 9 is a graph illustrating an example of data transfer rate control performed by the transfer rate management part 17.

A method of limiting the data transfer rate when the temperature score S reaches the threshold value A is not also particularly limited, and the limit value of the data transfer rate may be gradually decreased as illustrated in FIG. 9. In the example illustrated in FIG. 9, the temperature score S reaches the threshold value A at time t3 and, in response to this, the data transfer rate is limited to 90%, 80%, 70%, 60% and 60% in the period T4, T5, T6, T7 and T8, respectively. Thereafter, when the temperature score S4 reaches the threshold value B at time t4, limit on the data transfer rate is released. As described above, by gradually decreasing the limit value of the data transfer rate, it is possible to prevent a sudden drop of the data transfer rate after the temperature score S reaches the threshold value A.

Figure 10:
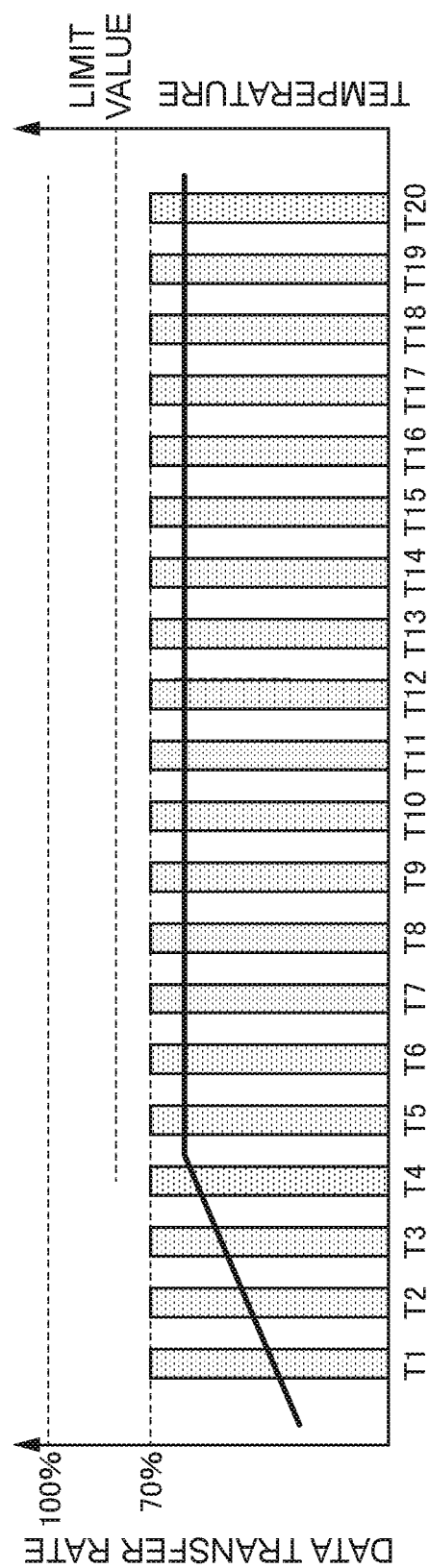
FIG. 10 is a graph illustrating an example of data transfer rate control performed by the transfer rate management part 17.

Further, a method that does not use the temperature score S may be adopted. That is, the upper limit of the data transfer rate at which the temperature of the flash memory system 2 does not reach its limit value is specified by actual measurement at design stage, and an actual data transfer rate is always limited to the specified upper limit or less. As an example, FIG. 10 illustrates an example in which the data transfer rate is limited to the maximum rate of 70%. In this case, even when continuous operation is performed in a state where the data transfer rate is fixed at 70%, the temperature of the flash memory system 2 will by no means reach its upper limit value.

It is apparent that the present invention is not limited to the above embodiments, but may be modified and changed without departing from the scope and spirit of the invention.

What is claimed is:

1. A memory controller controlling data transfer between a host system and a flash memory, wherein the memory controller is configured to monitor a data transfer rate per unit time, wherein the memory controller is configured to:
calculate a temperature score in a first period in accordance with a data transfer rate in the first period and a temperature score in a period prior to the first period,
determine whether the data transfer rate in the first period satisfies a predetermined condition, and
limit a data transfer rate in a second period following the first period to a predetermined rate lower than a maximum rate when the data transfer rate in the first period satisfies the predetermined condition, and wherein the temperature score in the period prior to the first period is not a temperature measured by, and is calculated without using, a temperature sensor.

2. The memory controller as claimed in claim 1, wherein the data transfer rate decreases to the predetermined rate from a start of the second period toward an end of the second period when the predetermined condition is satisfied.

3. The memory controller as claimed in claim 1, wherein the memory controller is configured to release a limit to the data transfer rate in a third period following the second period.

4. The memory controller as claimed in claim 1, wherein the predetermined condition is satisfied when the temperature score exceeds a threshold value.

5. The memory controller as claimed in claim 4, wherein the temperature score is corrected by keeping the data transfer rate constant for a predetermined period or by recognizing that a period during which data transfer is not performed has been continued for a certain period or more.

6. The memory controller as claimed in claim 1,
wherein the memory controller has information for calculating the temperature score in a current period in accordance with a data transfer rate in the current period and a temperature score in a previous period, and wherein the memory controller is configured to calculate the temperature score in the first period in accordance with the information, the data transfer rate in the first period and the temperature score in the period prior to the first period.

7. The memory controller as claimed in claim 6, the information shows how much the temperature score in the current period is increased or decreased based on the data transfer rate in the current period.

8. A flash memory system comprising:
a flash memory; and
a memory controller controlling data transfer between a host system and the flash memory, wherein the memory controller is configured to monitor a data transfer rate per unit time, wherein the memory controller is configured to:
calculate a temperature score in a first period in accordance with a data transfer rate in the first period and a temperature score in a period prior to the first period,
determine whether the data transfer rate in the first period satisfies a predetermined condition, and
limit a data transfer rate in a second period following the first period to a predetermined rate lower than a maximum rate when the data transfer rate in the first period satisfies the predetermined condition, and wherein the temperature score in the period prior to the first period is not a temperature measured by, and is calculated without using, a temperature sensor.

* * * * *